United States Patent
Cosentino et al.

(10) Patent No.: US 12,294,341 B2
(45) Date of Patent: May 6, 2025

(54) AUTOMATIC GAIN CONTROL CIRCUIT, CORRESPONDING RECEIVER, TRANSMITTER AND METHOD

(71) Applicant: STMicroelectronics S.r.l., Agrate Brianza (IT)

(72) Inventors: Gaetano Cosentino, Catania (IT); Carmelo Burgio, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 700 days.

(21) Appl. No.: 17/314,905

(22) Filed: May 7, 2021

(65) Prior Publication Data

US 2021/0359657 A1 Nov. 18, 2021

(30) Foreign Application Priority Data

May 13, 2020 (IT) .................. 102020000010834

(51) Int. Cl.
*H03F 3/19* (2006.01)
*H03D 3/00* (2006.01)
(Continued)

(52) U.S. Cl.
CPC .......... *H03G 3/3036* (2013.01); *H03D 3/009* (2013.01); *H03F 3/19* (2013.01); *H03F 3/21* (2013.01);
(Continued)

(58) Field of Classification Search
CPC .......... H03F 3/19; H03F 3/21; H03G 3/3036; H03G 1/0088; H03G 3/3042;
(Continued)

(56) References Cited

U.S. PATENT DOCUMENTS

| 9,065,537 B2* | 6/2015 | Georgantas ............ H04B 17/14 |
| 2007/0058739 A1* | 3/2007 | Aytur ................... H03G 3/3068 |
| | | 375/345 |

(Continued)

FOREIGN PATENT DOCUMENTS

EP 2704321 A1 3/2014

OTHER PUBLICATIONS

"A 0.25-dB-Step, 68-dB-Dynamic Range Analog Baseband With Digitally Assisted DCOC and AGC for Multi-Standard TV Applications", IEE Transactions on Circuits and Systems II: Express Briefs, IEE, US, vol. 66, No. 10, Oct. 1, 2019 (Oct. 1, 2019), pp. 1623-1627, XP011747723.

(Continued)

*Primary Examiner* — Andrea Lindgren Baltzell
*Assistant Examiner* — Khiem D Nguyen
(74) *Attorney, Agent, or Firm* — Crowe & Dunlevy LLC

(57) ABSTRACT

A receiver or transmitter circuit includes a signal propagation path between a radio-frequency (RF) signal node and a baseband processing circuit. Variable gain circuitry is configured to vary a gain applied to a signal propagating between the RF signal node and the baseband processing circuit. The variable gain circuitry varies the gain via first, coarse steps as well as via second, fine steps. This facilitates fine matching of the gains experienced by signals propagating over the in-phase and the quadrature branches in the transmitter and/or receiver circuit.

14 Claims, 8 Drawing Sheets

(51) Int. Cl.
   *H03F 3/21* (2006.01)
   *H03G 3/30* (2006.01)
   *H03M 1/66* (2006.01)
   *H04L 27/00* (2006.01)

(52) U.S. Cl.
   CPC ....... *H03M 1/66* (2013.01); *H04L 2027/0018* (2013.01)

(58) Field of Classification Search
   CPC .... H03G 3/3052; H03G 3/3068; H03D 3/009; H03M 1/66; H04L 2027/0018
   USPC .......................................................... 330/285
   See application file for complete search history.

(56) References Cited

U.S. PATENT DOCUMENTS

| | | |
|---|---|---|
| 2009/0238313 A1 | 9/2009 | Wang et al. |
| 2013/0336143 A1 | 12/2013 | Choksi et al. |

OTHER PUBLICATIONS

IT Search Report and Written Opinion for IT Appl. No. 102020000010834 dated Jan. 15, 2021 (13 pages).

\* cited by examiner

AUTOMATIC GAIN CONTROL CIRCUIT, CORRESPONDING RECEIVER, TRANSMITTER AND METHOD

PRIORITY CLAIM

This application claims the priority benefit of Italian Application for Patent No. 102020000010834, filed on May 13, 2020, the content of which is hereby incorporated by reference in its entirety to the maximum extent allowable by law.

TECHNICAL FIELD

The description relates to automatic gain control (AGC) circuits.

One or more embodiments can be applied in receivers and transmitters adopting in phase (I) and quadrature (Q) architectures.

BACKGROUND

An automatic gain control (AGC) circuit is a circuit capable of maintaining an output signal amplitude irrespective of a variation in an input signal amplitude.

Also, the designation "I&Q", referring to in-phase and quadrature, applies to a variety of circuit architectures where an "in-phase" signal (I) occurs along with a "quadrature" signal (Q) shifted 90 degrees with respect to the in-phase signal.

In various devices such as receivers and transmitters, a gain mismatch of the in-phase (I) and the quadrature (Q) signals may undesirably degrade performance, in terms of modulation/demodulation performance, for instance.

For instance, a I&Q gain mismatch variation due to different gain settings may give rise to issues in demodulator and image rejection post-processing in a receiver and to unwanted emissions in a transmitter.

There is a need in the art to contribute in overcoming the drawbacks outlined in the foregoing.

SUMMARY

One or more embodiments may relate to a circuit.

One or more embodiments may relate to a corresponding receiver with said circuit.

One or more embodiments may relate to a corresponding transmitter with said circuit.

One or more embodiments may relate to a corresponding method implemented by the circuit.

One or more embodiments may achieve a good degree of accuracy in compensating I&Q mismatch in receivers and transmitters adopting I&Q architectures with a well controlled small-step and slew-rate-controllable gain variation.

One or more embodiments may offer a compact and flexible solution which can be easily adapted for a specific architecture.

One or more embodiments facilitate setting the gain of I&Q receiver and transmitter chains with satisfactory accuracy and with the possibility of compensating I&Q gain mismatch.

In one or more embodiments, gain changes can be implemented with small gain steps with well-controlled slew rate.

One or more embodiments facilitate reducing transient spurious generation in a receiver chain and in a transmitter output power.

For instance, in one or more embodiments, a variation of 1 dB can be implemented as a sequence of consecutive small steps (0.1 dB, for instance). This effectively counters demodulator blocking and unlocking from a receiver side as well as transient spurious emissions in a transmitted signal.

Operation of one or more embodiments may contemplate opposite gain changes: for instance, +1 dB at an intermediate frequency (IF) or radio frequency (RF) variable gain amplifier (VGA) and −1 dB at an associated mixer, after which the mixer gain can be set to 0 dB using steps of 0.1 dB each, for instance.

One or more embodiments are suited to be implemented via Fully Depleted Silicon On Insulator (FDSOI) technologies.

In conventional bulk technologies, a small gain step variation can be obtained changing the bias current in a main amplifier and/or mixer, for instance.

One or more embodiments may be applied to I&Q architectures (that is, architectures including an I chain and a Q chain) as well as to single-chain architectures (I chain only, for instance) both in receivers and in transmitters.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

As discussed previously, while architectures including an in-phase (I) chain and a quadrature (Q) chain, referred to as I&Q architectures, will be primarily discussed in the following, one or more embodiments may be applied to single-chain arrangements (I chain, for instance) in receivers as well as in transmitters.

Also, throughout the instant description, like parts or elements will be indicated with like reference symbols in the figures and a corresponding description will not be repeated for each and every figure for the sake of brevity.

Figure 1:
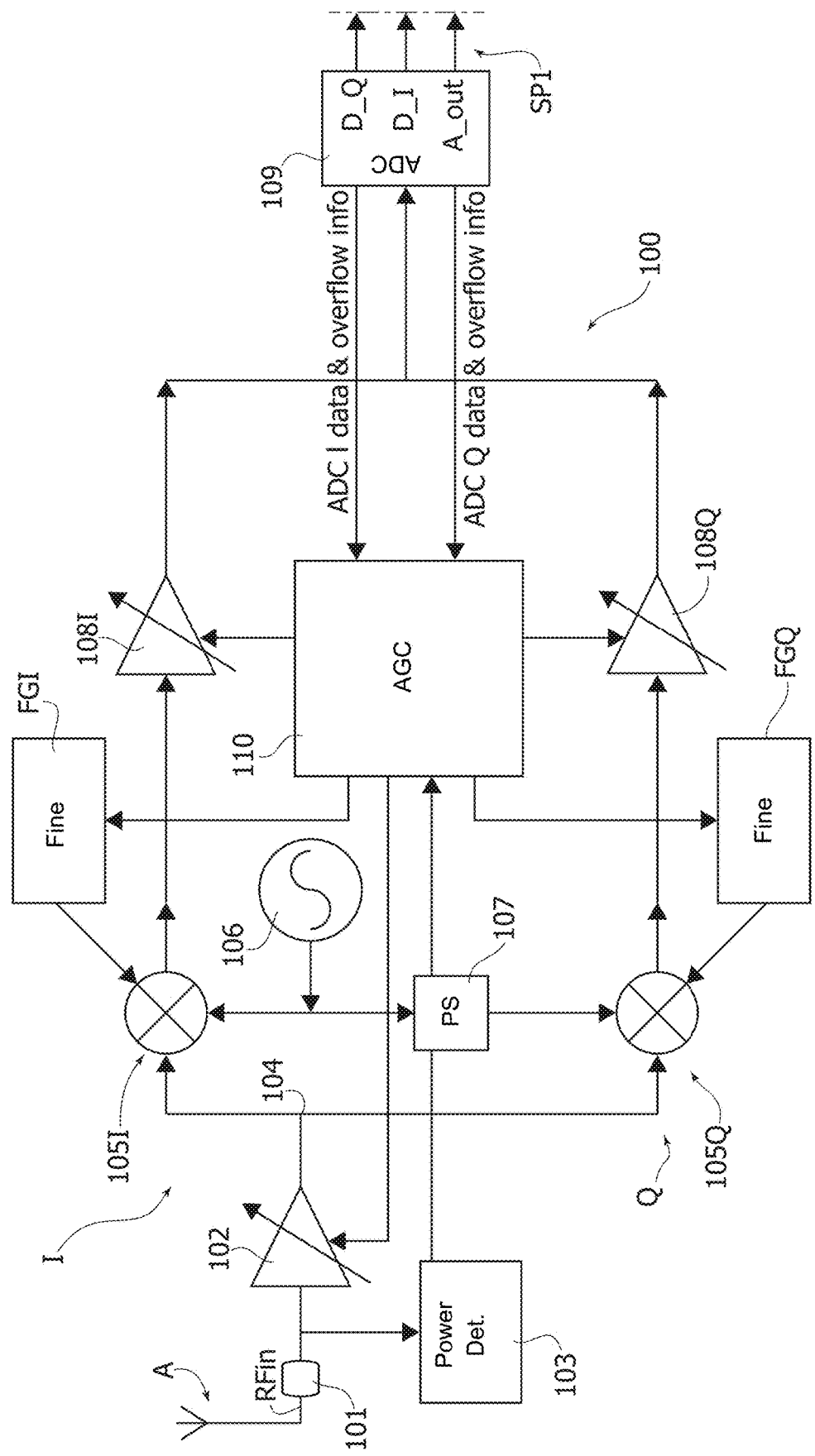
FIG. 1 is a block diagram of a receiver chain including AGC circuitry as per embodiments of the present description.

Reference 100 in FIG. 1 denotes as a whole an I&Q receiver chain coupled to a (receiver) antenna A—which per se may be a distinct element from the embodiments—to receive a radio frequency (RF) signal RFin at an input node 101.

After propagating through a radiofrequency variable gain amplifier (RF-VGA) 102, the signal RFin—whose power is detected by a power detector 103 configured to produce a (e.g., digital) power level signal indicative of the power of RFin—is split at node 104 over an "in phase" branch I and a "quadrature" branch Q.

As illustrated in FIG. 1, the following processing is applied to the signal thus split over the branches I and Q:

frequency (down) conversion via mixing at a mixer 105I, 105Q with a frequency conversion signal produced by a local oscillator 106; as illustrated, the local oscillator signal from local oscillator 106 is phase-shifted over 90 degrees at a phase shifter (PS) 107 (or smaller phase steps—e.g., eight phases in 45° steps—if an harmonic mixer is used) prior to being applied to the mixer 105Q in the quadrature branch Q; and current-to-voltage conversion at a transimpedance amplifier (briefly, TIA) 108I, 108Q, possibly operating at a down-converted intermediate frequency (IF).

Using a harmonic mixer may be advantageous insofar as this facilitates higher gain/lower conversion loss in possible addition to a reduction of the absolute value of mismatch between I and Q. An adjustment via "fine" gain steps can be implemented in the sub-sections of a harmonic mixer substantially as discussed herein, with the proviso that using harmonic mixers becomes less simple in the presence of very high RF frequencies (which may be the case of 77 GHz radars).

The signals resulting from such processing are then jointly applied to an analog-to-digital converter (ADC) 109 for further baseband data processing SP1 (demodulation and decoding, for instance).

Such processing as indicated by SP1 may possibly involve at least partly distinct processing of in-phase and quadrature components D_I, D_Q and amplitude component A_out, as may be the case of QPSK signals received, via further circuitry not visible in the figure for simplicity.

It will be otherwise appreciated that a receiver architecture and the related principles of operation as discussed in the foregoing are known to those of skill in the art, which makes it unnecessary to provide a more detailed description. This applies primarily (but not exclusively) to the details of processing such as demodulation and decoding applied to the signal from the converter 109. In that respect, those of skill in the art will appreciate that one or more embodiments are advantageously related to gain control which may be largely "transparent" to the type of modulation and encoding applied to the signal RFin.

Figure 2:
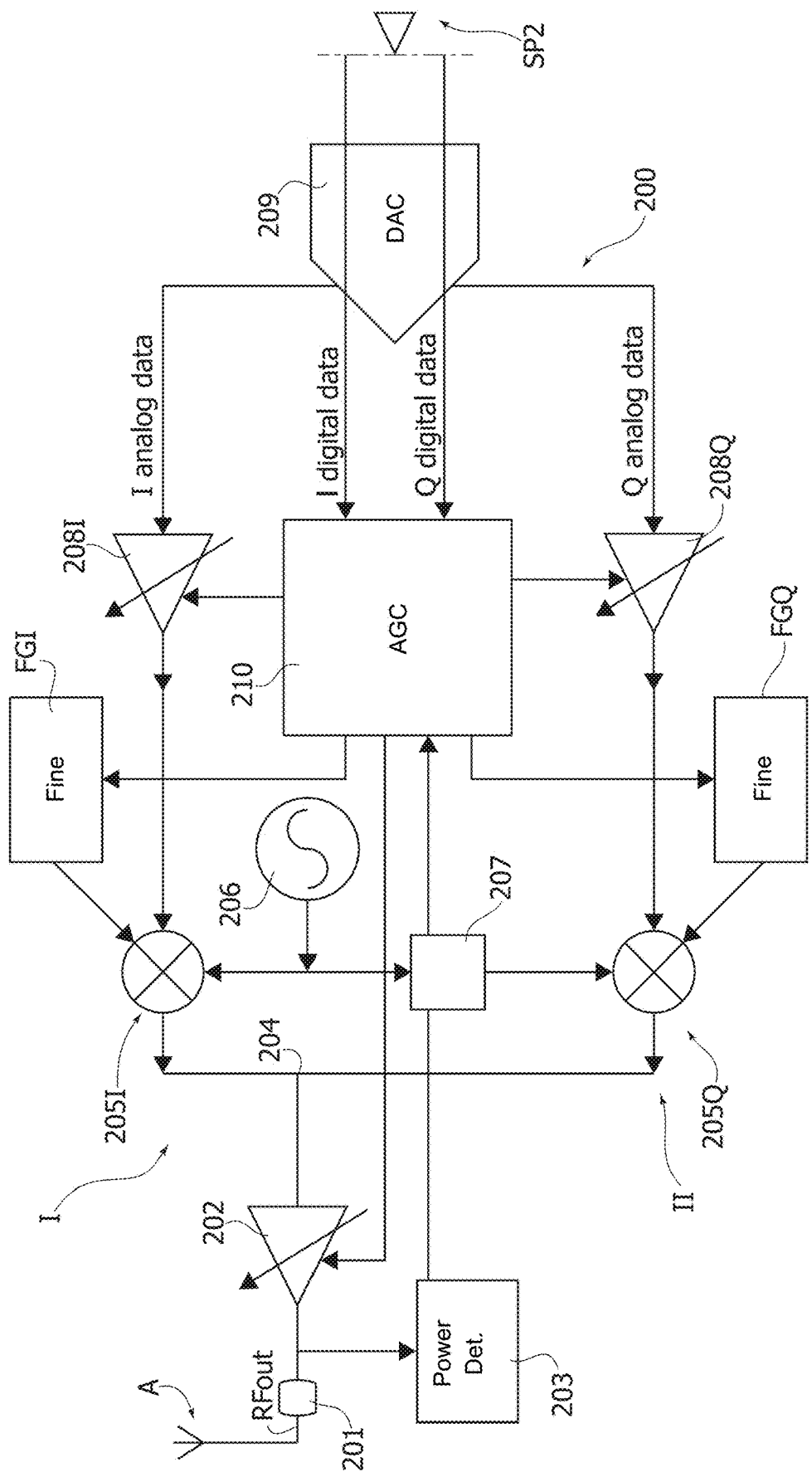
FIG. 2 is a block diagram of a transmitter chain including AGC circuitry as per embodiments of the present description.

The previous description of a receiver architecture provided in connection with FIG. 1 and referring to a signal propagating from left to right from the input node 101 (receiver antenna A) towards the ADC converter 109 essentially applies mutatis mutandis to a transmitter architecture as illustrated in FIG. 2. FIG. 2 is exemplary of a transmitter circuit where a signal propagates from right to left from an input circuit 209, including a digital-to-analog (DAC) converter, towards an output node 201 coupled to a transmitter antenna A (which, as known to those of skill in the art, may be the same antenna of FIG. 1).

The similarity of the architectures illustrated in FIG. 1 (receiver) and in FIG. 2 (transmitter) is evidenced by like/complementary parts or elements being indicated with corresponding reference numbers starting with "1" in FIG. 1 and with "2" in FIG. 2.

The same approach will be adopted also for the other figures, being otherwise understood that, throughout the instant description, like parts or elements will be indicated with like reference symbols in the figures, so that a corresponding description will not be repeated for each and every figure for the sake of brevity.

In a I&Q transmitter chain 200 coupled to a (transmitter) antenna A—which, again, may per se be a distinct element from the embodiments—signals to be transmitted are applied to a transmitter input circuit 209.

As illustrated, these signals result from processing SP2 (modulation and encoding, for instance) which may possibly involve at least partly distinct processing of in-phase and quadrature components, as may be the case of QPSK signals, performed via further circuitry not visible in the figure for simplicity.

As illustrated, the input circuit 209 may include a digital-to-analog (DAC) converter after which the (analog) data signal to be transmitted is split into "in phase" data (I analog data) and "quadrature" data (Q analog data) forwarded to "in phase" branch I and a "quadrature" branch Q.

As illustrated in FIG. 2, the following processing is applied to the signal thus split over the branches I and Q:

voltage-to-current conversion at a transconductance amplifier (briefly, TA) 208I, 208Q, possibly operating at intermediate frequency (IF); and frequency (up) conversion via mixing at a mixer 205I, 205Q with a frequency conversion signal produced by a local oscillator 206, with the local oscillator signal from 206 phase-shifted over 90 degrees at a phase shifter 207 prior to being applied to the mixer 205Q.

The signals resulting from such processing are then jointly applied (see node 204), via a radiofrequency variable gain amplifier (RF-VGA) 202, to an output node 201 to be transmitted from the antenna A as a transmitted RF signal RFout.

The power of RFout is detected by a power detector 203 configured to produce an (e.g., digital) signal power level signal indicative of the power of RFout.

It will be again appreciated that, as in the case of the receiver architecture of FIG. 1, a transmitter architecture and the related principles of operation as discussed in the foregoing in connection with FIG. 2 are known to those of skill in the art, which makes it unnecessary to provide a more detailed description.

Again, this applies primarily (but not exclusively) to the details of processing SP2 such as modulation and encoding applied to the signal at the input circuit 209. In that respect, those of skill in the art will appreciate that one or more embodiments are advantageously related to gain control which may be largely "transparent" to the type of modulation and encoding applied to the signal finally transmitted as RFout.

Comparison of FIG. 1 and FIG. 2 shows that the receiver architecture 100 of FIG. 1 and the transmitter architecture 200 of FIG. 1 are both exemplary of circuits comprising at least one signal propagation path between:
  an RF signal node (that is a circuit node such as 101 or 201 at which a RF signal occurs) having a power detector (103 or 203) coupled therewith (via the RF-VGA 102 or 202, for instance); and
  baseband processing circuitry (as exemplified by 109, SP1 and 209, SP2);
  wherein the at least one signal propagation path (I or Q) comprises:
    a frequency converter (see the down-conversion mixers 105I, 105Q and the up-conversion mixers 205I, 205Q) coupled with a conversion signal generator 106; and
    a conversion between voltage and current (see the voltage-to-current converters 108I, 108Q and the current-to-voltage converters 208I, 208Q, possibly operating at an intermediate frequency or IF).

As illustrated in FIG. 1 and FIG. 2, the conversion between voltage and current (108I, 108Q; 208I, 208Q) is performed intermediate of (i.e., between) the frequency converter (mixers 105I, 105Q or 205I, 205Q) and the baseband processing circuitry (109, SP1; 209, SP2). Stated otherwise, as illustrated in FIG. 1 and FIG. 2, the frequency converter (105I, 105Q or 205I, 205Q) is located intermediate the RF signal node (101; 201) and the converter between voltage and current (108I, 108Q; 208I, 208Q).

Reference to "at least one" signal propagation path is related to the fact that, as discussed previously, while I&Q architectures (that is, architectures including an I branch or chain and a Q branch or chain) are exemplified in figures such as FIGS. 1 and 2, one or more embodiments may be applied to single-chain arrangements (I chain, for instance) in receivers as well as in transmitters.

Figure 9:
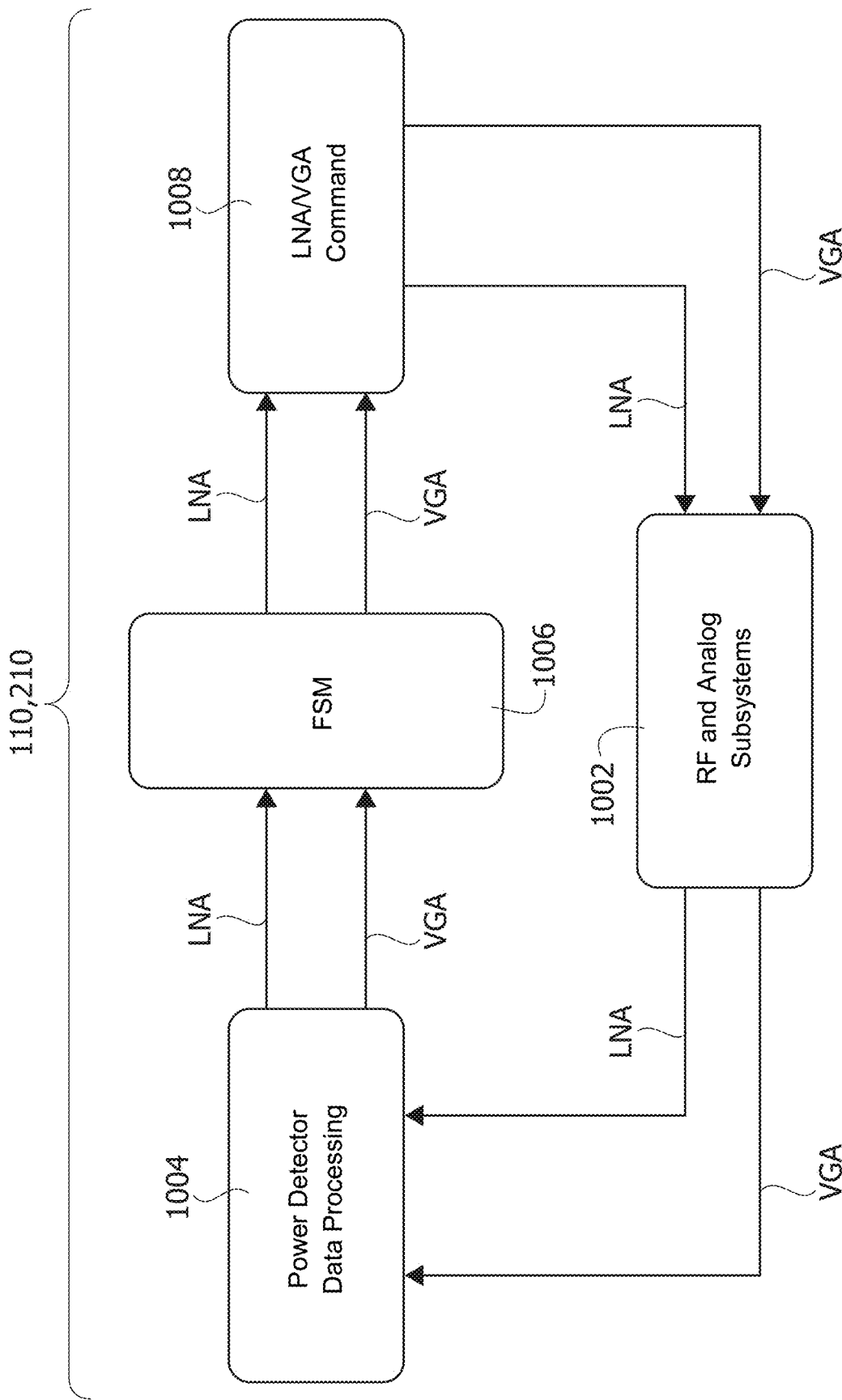
FIG. 9 is an exemplary system data flow diagram in receiver and/or transmitter chains including AGC circuitry as per embodiments of the present description.

In FIGS. 1 and 2 references 110 and 210 denote automatic gain control (AGC) circuitry which may be comprise a state machine (FSM), for instance (see also FIG. 9 and the related description).

As exemplified in FIGS. 1 and 2, the automatic gain control (AGC) circuitry 110 or 210 is sensitive to the (digital) output signal from the power detector circuits 103, 203 coupled with the output of the RF (variable gain) amplifiers 102, 202. The automatic gain control (AGC) circuitry 110 or 210 thus receives information as to the (power) level or strength of the RF signal received (RFin, sensed at 101 in FIG. 1, as detected at the output of the RF VGA 102) and of the RF signal transmitted (RFOUT, sensed at 201 in FIG. 2, as detected at the output of the RF VGA 202).

As exemplified in FIGS. 1 and 2, the automatic gain control (AGC) circuitry 110 or 210 is also sensitive to the data received or transmitted.

For instance, in the case of a receiver 100 as exemplified in FIG. 1, the automatic gain control (AGC) circuitry 110 is sensitive to data & overflow information as obtained from the analog-to-digital converter 109 for the in-phase branch or chain I (ADC I data & overflow info) and for the quadrature branch or chain Q (ADC Q data & overflow info).

For instance, in the case of a receiver 100 as exemplified in FIG. 1 and in the case of a transmitter 200 as exemplified in FIG. 2, the automatic gain control (AGC) circuitry 110, 210 is configured to perform, as a function of the RF power level information and the data information as discussed in the foregoing, a control action of the gains of:
  the RF variable gain amplifiers 102, 202;
  the mixers 105I, 105Q and mixers 205I, 205Q; and
  the conversion between voltage and current, namely the TIAs 108I, 108Q of FIG. 1 and the TAs 208I, 208Q of FIG. 2.

It is noted that, both receiving the RF power level information via the detectors 103, 203 and performing the gain control actions discussed previously may involve radio frequency (RF) and/or intermediate frequency (IF) power detectors which, for simplicity, may be assumed to be included in the automatic gain control circuitry 110, 210.

In one or more embodiments as exemplified herein, such a gain control action may include:
  a "coarse" control (in 1 dB steps, for instance) of the gains of the RF variable gain amplifiers 102, 202, and the TIAs 108I, 108Q and TAs 208I, 208Q; and
  a "fine" control (in steps of 0.1 dB or less) of the gains of the mixers 105I, 105Q and mixers 205I, 205Q for the I branch or chain (as exemplified by the blocks FGI) and for the Q branch or chain (as exemplified by the blocks FGQ).

Figure 3:
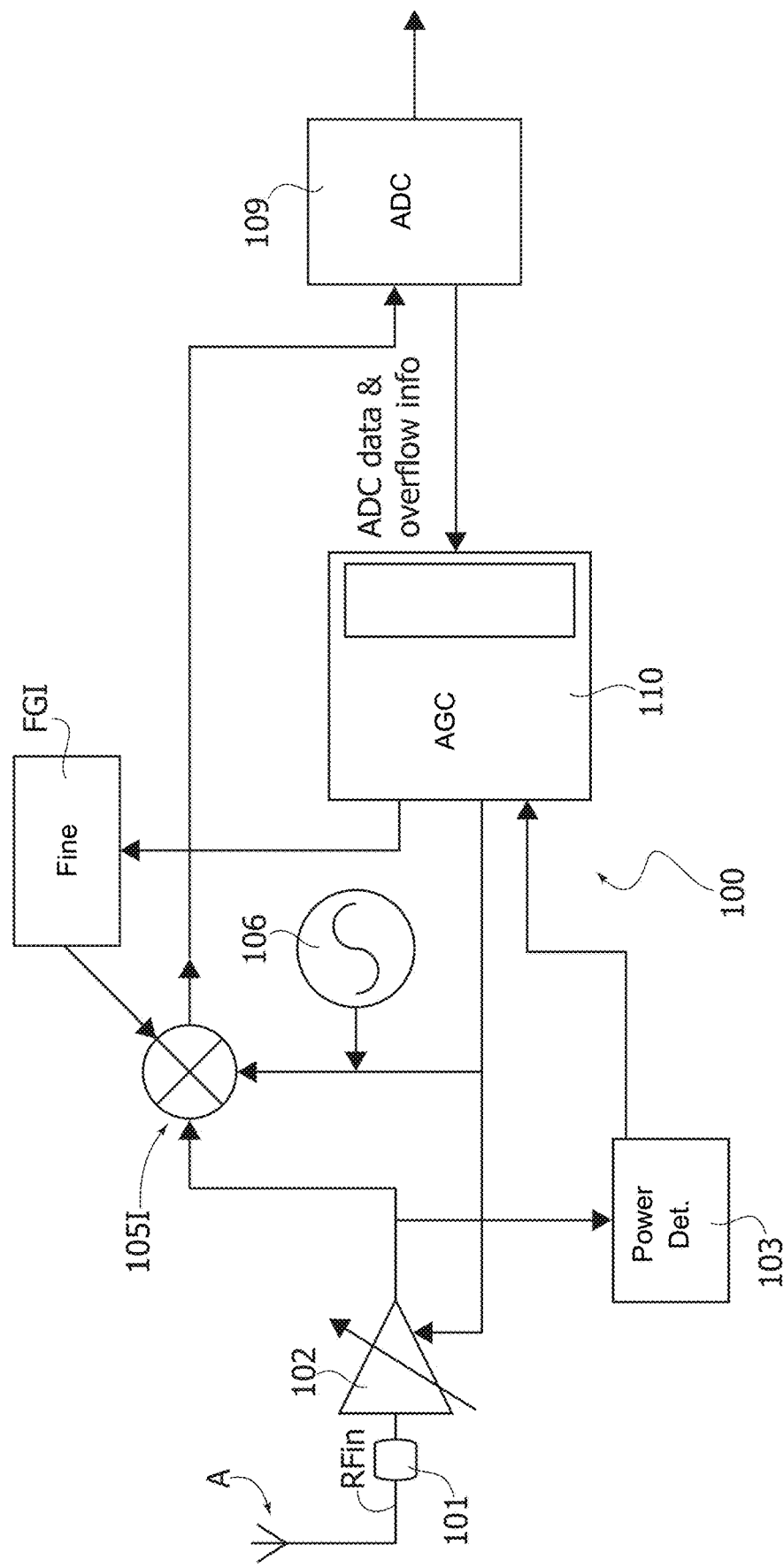
FIGS. 3 to 5 are block diagrams exemplary of possible details and/or variants of a receiver chain as exemplified in FIG. 1.
Figure 4:
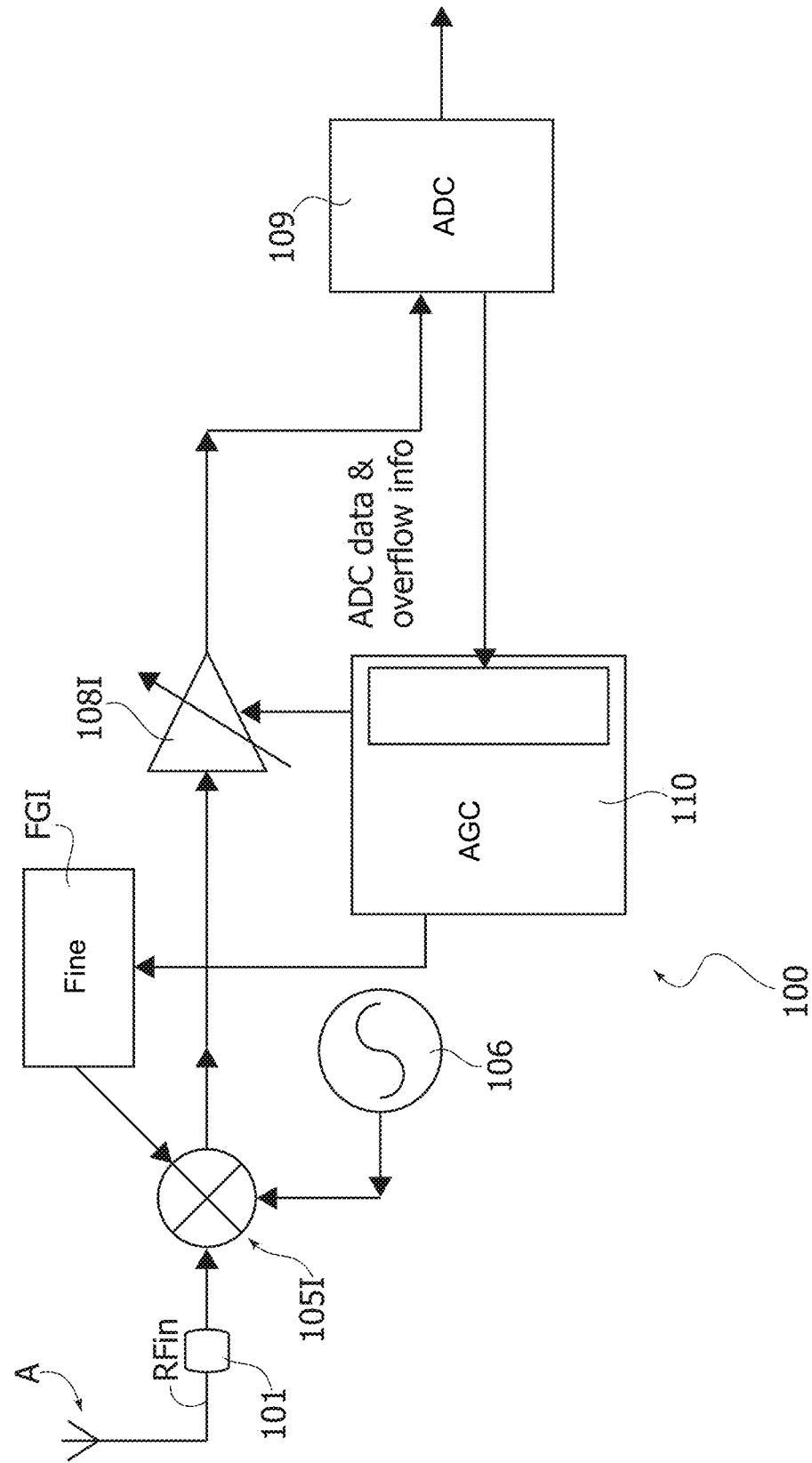
Figure 5:
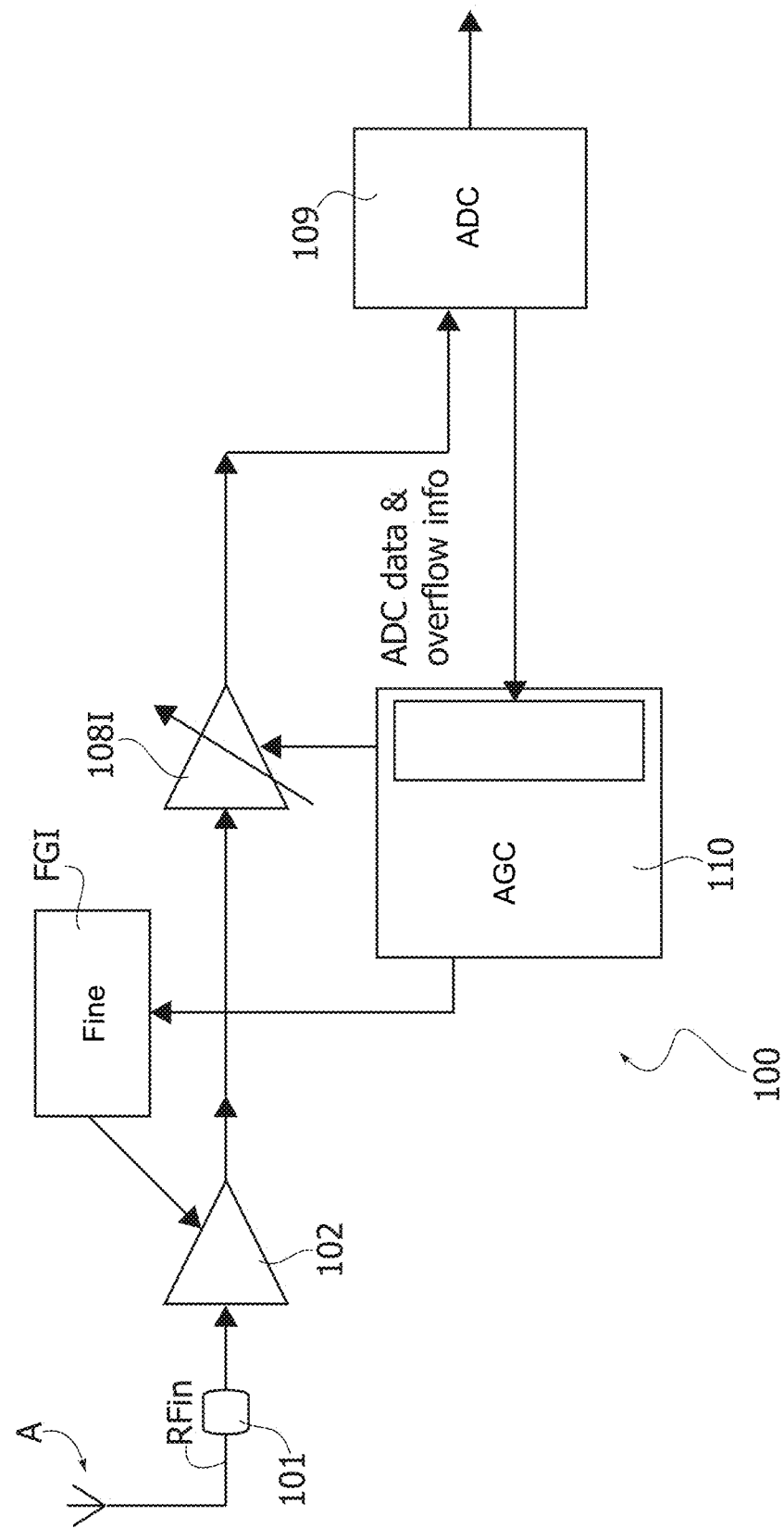

FIGS. 3 to 5 are exemplary of possible details/variants which may be introduced in a receiver architecture as exemplified in FIG. 1.

In FIGS. 3 to 5, parts or elements like parts or elements already discussed in connections with the previous figures are indicated with like reference symbols and a corresponding description of these parts or elements will not be repeated for the sake of brevity.

Also in FIGS. 3 to 5, only the in-phase branch or chain I of the receiver architecture 100 is visible. It will be otherwise understood that the same details/variants exemplified in connection with the in-phase branch or chain I of the receiver may be applied to the quadrature branch or chain Q.

Also, as repeatedly discussed previously, one or more embodiments may comprise a single-chain arrangements (I chain only, for instance) in receivers as well as in transmitters.

Briefly, FIGS. 3 to 5 are exemplary of embodiments where:
  the TIA 108I (and TIA 108Q), such as IF stages, for instance, may be dispensed with (FIG. 3); and/or
  the RF VGA 102 may be dispensed with (FIG. 4); and/or
  the down-conversion mixer 105I (and mixer 105Q) may be dispensed with, with direct RF to ADC conversion taking place (which is feasible for instance in the case of reception in the MW or SW bands 0.5, . . . , 30 MHz) with RF VGA 102 being a low-noise variable amplifier which provides conditioning of the signal fed into TIA 108I (or TIA 108Q), for instance (FIG. 5).

While FIG. 5 shows block FGI represented as a distinct element for clarity and ease of understanding, it will be appreciated that, in one or more embodiments the automatic gain control (AGC) circuitry (a FSM, for instance) may drive the amplifier 102 directly. This drive action may involve applying to the amplifier 102 gain steps (1 dB steps for instance) aimed at compensating gain variations in the opposite direction at TIA 108I (or TIA 108Q) and finally adjusting the final gain as desired with a small gain adjustment DAC such as FGI incorporated therein.

FIG. 5 is exemplary of embodiments which take advantage of the possibility of realizing gain stages such as amplifiers admitting, for instance a +/−1.5 dB gain total variation (or otherwise a fixed/variable main gain) along with fine tuning of gain (in <0.1 dB steps, for instance).

This may occur in a manner known per se to those of skill in the art, for instance by varying the open loop gain of the amplifier using $V_{bulkgate}$ of field-effect transistors such as mosfet transistors therein and/or by bias changes or similar techniques.

Figure 6:
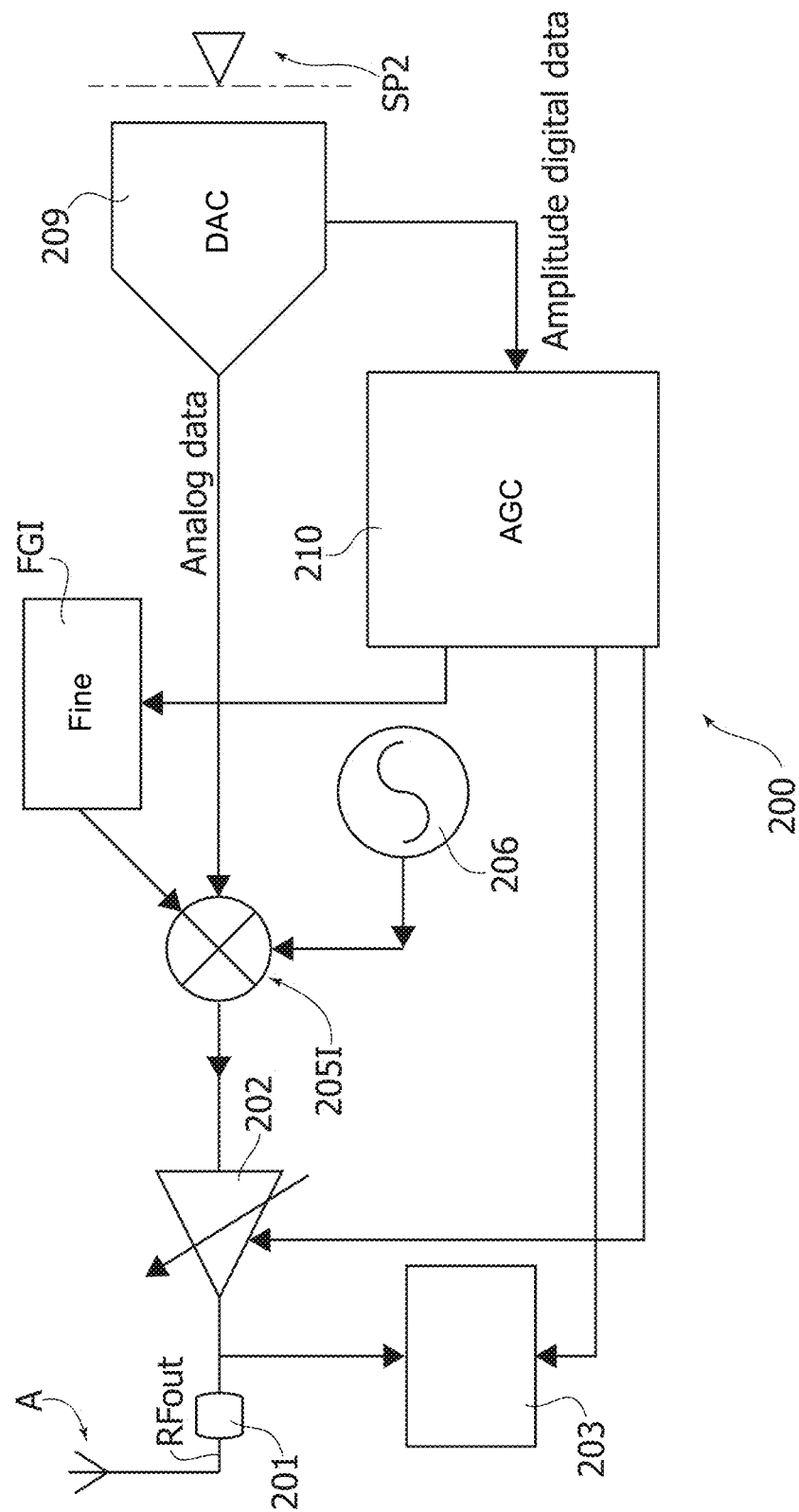
FIGS. 6 and 7 are block diagrams exemplary of possible details and/or variants of a transmitter chain as exemplified in FIG. 2.
Figure 7:
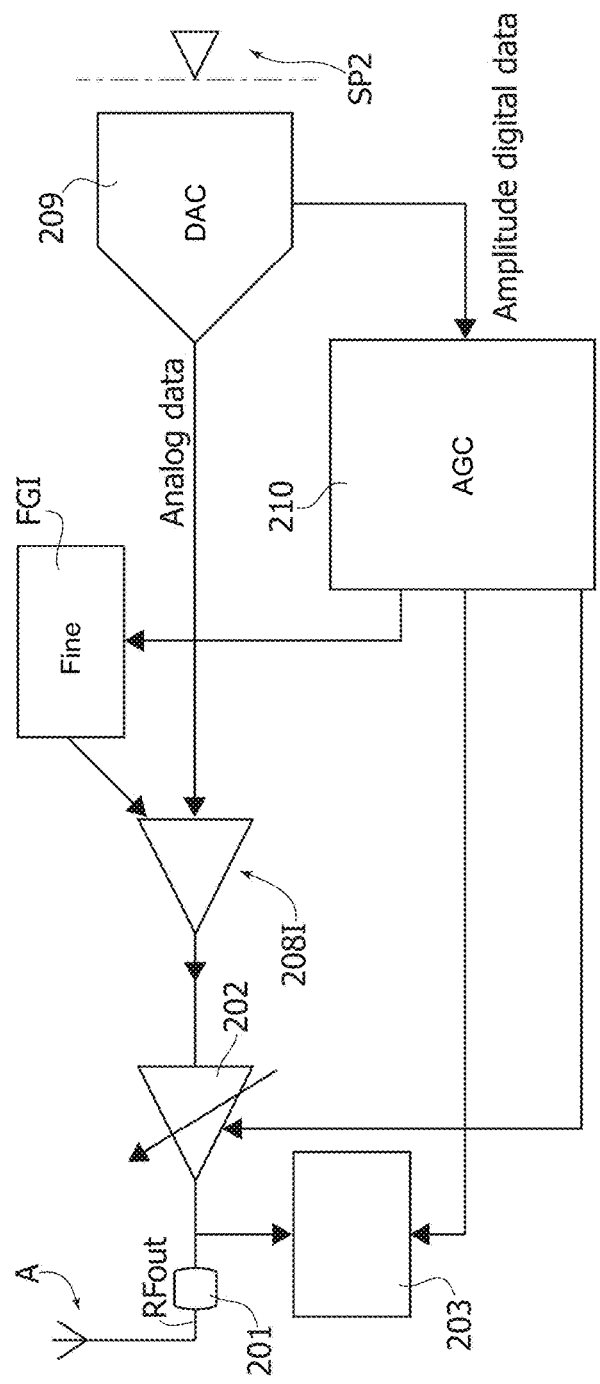

FIGS. 6 and 7 are exemplary of possible details/variants which may be introduced in a transmitter architecture as exemplified in FIG. 2.

Once more, in FIGS. 6 and 7, parts or elements like parts or elements already discussed in connections with the previous figures are indicated with like reference symbols and a corresponding description of these parts or elements will not be repeated for the sake of brevity.

Also, in FIGS. 6 and 7, only the in-phase branch or chain I of the transmitter architecture 200 is visible, being otherwise understood that the same details/variants exemplified in connection with the in-phase branch or chain I of the transmitter may be applied to the quadrature branch or chain Q.

Also, as repeatedly discussed previously, one or more embodiments may comprise single-chain arrangements (I chain only, for instance) in receivers as well as in transmitters.

Briefly, FIGS. 6 and 7 are exemplary of embodiments where:

the TA 208I (and TA 208Q), such as IF stages, for instance, is/are dispensed with—FIG. 6; and/or the up-conversion mixer 205I (and mixer 205Q) may be dispensed with with direct DAC to RF conversion taking place at TA 208I (or TA 208Q)—FIG. 7.

Again, while FIG. 7 shows block FGI represented as a distinct element for clarity and ease of understanding, it will be appreciated that, in one or more embodiments the automatic gain control (AGC) circuitry (a FSM, for instance) may drive TA 208I (or TA 208Q) directly. This drive action may involve gain steps (1 dB steps for instance) aimed at compensating gain variations in the opposite direction at the RF amplifier 202 and finally adjusting the final gain as desired with a small gain adjustment DAC, referred to as FGI (or FGQ) incorporated therein.

FIG. 7 is again exemplary of embodiments which take advantage of the possibility of realizing gain stages such as amplifiers admitting, for instance a +/−1.5 dB gain total variation (or otherwise a fixed/variable main gain) along with fine tuning of gain (in <0.1 dB steps, for instance).

As discussed previously, this may occur in a manner known per se to those of skill in the art, for instance by varying the open loop gain of the amplifier using $V_{bulkgate}$ of field-effect transistors such as mosfet transistors therein and/or by bias changes or similar techniques.

It noted that both FIGS. 6 and 7 are exemplary of embodiments where a transmitter chain as illustrated can be driven directly by an analog signal.

In that case, the output from the RF power detector 202 can be used directly. Alternatively a power/voltage detector can be used.

Both FIGS. 6 and 7 are exemplary of embodiments where a DAC such as 209 may provide both "digital" modulations (QPSK, for instance) as well "analog" modulations, such as digitized streams from AM/FM modulations, namely analog modulations processed digitally, namely sampled via ADC sampling and encoded/conditioned/filtered via digital processing.

Figure 8:
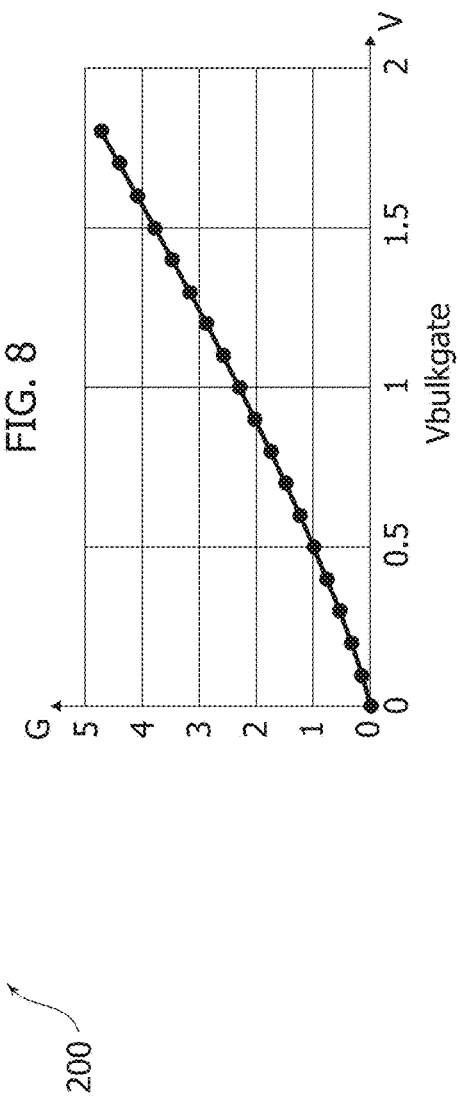
FIG. 8 is exemplary of the possibility of varying the gain in a mosfet-based gain stage.

FIG. 8 is further exemplary of the possibility of realizing gain stages (here, a mosfet-based mixer stage of otherwise conventional design) where the $V_{bulkgate}$ voltage of the mixer (abscissa scale) can be varied—using a DAC or in another way, for instance—over a range from 0 V to 2 V while obtaining a small gain variation (relative mixer gain, ordinate scale, absolute values). For instance, a variation less than 0.1 dB with a gain range of 2.3 dB for $V_{bulkgate}$ from 0 V to 1.1 V up to 4 dB for $V_{bulkgate}$ from 0 V to 1.8 V may be exemplary of such operation.

It is otherwise noted that, in one or more embodiments details and/or variants here exemplified in connection with FIGS. 3 to 5 (receiver) can be applied to a transmitter chain; likewise, details and/or variants here exemplified in connection with FIGS. 6 and 7 (transmitter) can be applied to a receiver chain.

FIG. 9 is an exemplary system data flow diagram in receiver and/or transmitter chains including AGC circuitry as per embodiments of the present description.

In FIG. 9 reference 1002 indicates as a whole RF and analog subsystems such as power detectors 103, 203 configured to sense the power level at the RF VGA amplifiers as power detectors 103, 203 and at the other gain stages (mixers, TIAs, TAs) and send corresponding signals, denoted VGA and LNA in FIG. 9, towards power detector data processing circuitry 1004.

The designation LNA is related to the fact that, in one or more embodiments, these other gain stages may be implemented using low-noise amplifiers (LNAs).

Also, circuitry illustrated as a distinct element in FIG. 9 for simplicity may in fact be a part of the control circuitry denoted 110, 210 in the previous figures.

In one or more embodiments, the circuitry 110, 210 may include a finite state machine (FSM) 1006 configured to receive from the power detector data processing circuitry 1004 gain change request signals again indicated as VGA (RF amplifiers as 103, 203) and LNA (other gain stages such as mixers, TIAs, TAs).

As a result of processing such request signals (which, as discussed, may involve both "coarse" and "fine" variation steps such as 1 dB steps and steps less than 0.1 dB), the control FSM may issue gain change acknowledgement signals again indicated as VGA (RF amplifiers as 103, 203) and LNA (other gain stages such as mixers, TIAs, TAs) towards LNA/VGA command actuators 1008 (of any known type to those of skill in the art as a function of the receiver/transmitter characteristics).

The action of the actuators 1008 results in corresponding gain changes, again indicated as VGA (RF amplifiers as 103, 203) and LNA (other gain stages such as mixers, TIAs, TAs), which are sensed via command interfaces (of any known type to those of skill in the art as a function of the receiver/transmitter characteristics).

This in turn results in the RF and analog subsystems designated 1002 to send corresponding signals VGA, LNA towards the power detector data processing circuitry 1004.

A circuit as exemplified herein (for instance, 100 or 200) may comprise:

at least one signal propagation path (for instance I and/or Q) between a RF signal node (for instance, 101, 201) and baseband processing circuitry (for instance, 109, SP1 or 209, SP2);

variable gain circuitry (for instance, 102, 105I, 105Q, 108I, 108Q or 202, 205I, 205Q, 208I, 208Q) in said at least one signal propagation path, the variable gain circuitry configured (for instance, 110, 210) to vary a gain applied to a signal propagating between said RF signal node and said baseband processing circuitry;

wherein the variable gain circuitry is configured to vary said gain via first, coarse steps (applied, for instance, at 102, 108I, 108Q or 202, 208I, 208Q) as well as via second, fine steps (applied, for instance, at 105I, 105Q or 205I, 205Q).

In a circuit as exemplified herein, said second, fine steps may be submultiples of said first, coarse steps.

In a circuit as exemplified herein:
said first, coarse steps may comprise gain variations in dB units; and
said second, fine steps may comprise gain variations up to about 0.1 dB.

In a circuit as exemplified herein:
said at least one signal propagation path may comprise a mixer circuit (for instance, 105I, 105Q or 205I, 205Q) intermediate said RF signal node and said baseband processing circuitry; and
said variable gain circuitry in said at least one signal propagation path comprises fine gain variation control circuitry (for instance, FGI) configured to vary the gain of said mixer circuit via said second, fine steps.

In a circuit as exemplified herein said at least one signal propagation path may comprise at least one of:
a radiofrequency amplifier (for instance, 102, 202) intermediate said RF signal node and said mixer circuit; and
a gain stage (for instance, 108I, 108Q or 208I, 208Q) intermediate said mixer circuit and said baseband processing circuitry (for instance, 109, SP1 or 209, SP2);
wherein said variable gain circuitry in said at least one signal propagation path may comprise coarse gain variation control circuitry configured to vary the gain of at least one of said radiofrequency amplifier and said gain stage via said first, coarse steps (for instance, with the fine steps applied to the mixers via FGI as exemplified in FIGS. 1 and 2).

In a circuit as exemplified herein, said at least one signal propagation path may comprise at least one of:
a radiofrequency amplifier intermediate said RF signal node and said mixer circuit; and
a gain stage intermediate said mixer circuit and said baseband processing circuitry;
wherein said at least one of a radiofrequency amplifier and a gain stage may be configured to vary a gain applied to a signal propagating therethrough both via said first, coarse steps as well as via said second, fine steps (as exemplified in FIG. 5 or 7, where the amplifier 102 or the gain stage 208I may provide both coarse steps to compensate complementary gain changes at 108I or 202 as well as fine gain tuning as desired).

A circuit as exemplified herein (see for instance, 100 and 200 in FIGS. 1 and 2) may comprise:
a first signal propagation path (for instance, I) between said RF signal node and said baseband processing circuitry, the first signal propagation path configured to propagate a first (in phase) signal; and
a second signal propagation path (for instance, Q) between said RF signal node and said baseband processing circuitry, the second signal propagation path configured to propagate a second signal, wherein the second signal is in quadrature (see, for instance, the phase shifters 107, 207) to the first signal.

In a circuit as exemplified herein, the first signal propagation path and the second signal propagation path may comprise variable gain circuitry configured to vary a first gain applied to the first signal propagating through the first signal propagation path and a second gain applied to the second signal propagating through the second signal propagation path wherein said first gain matches said second gain.

A receiver device (for instance, 100 in FIG. 1) may comprise a circuit as exemplified herein, wherein said at least one signal propagation path (I and/or Q) is configured to propagate a radio-frequency signal received at said RF signal node towards baseband receiver processing circuitry.

A transmitter device (for instance, 200 in FIG. 2) may comprise a circuit as exemplified herein, wherein said at least one signal propagation path (I and/or Q) is configured to propagate a baseband signal received at said baseband processing circuitry towards an RF signal node for transmission therefrom as a radio-frequency signal.

A method of operating a circuit, a receiver device or a transmitter device as exemplified herein may comprise operating said variable gain circuitry in said at least one signal propagation path:
varying said gain in said at least one signal propagation path via first, coarse steps of equal amplitude having opposite signs at different locations of said at least one signal propagation path (for instance, +1 dB at 108I, 108Q or 208I, 208Q or at 102 or 202 and −1 dB at the associated mixers 105I, 105Q or 205I, 205Q); and
varying said gain in said at least one signal propagation path via second, fine steps at one location (for instance, as steps of 0.1 dB or less applied to the mixers 105I, 105Q or 205I, 205Q) of said at least one signal propagation path.

Without prejudice to the underlying principles, the details and embodiments may vary, even significantly, with respect to what has been described by way of example only, without departing from the extent of protection.

The extent of protection is determined by the annexed claims.

The claims are an integral part of the technical teaching on embodiments as provided herein.

The invention claimed is:

1. A circuit, comprising:
a radio frequency (RF) signal node;
an RF power detector configured to detect power of an RF signal at said RF signal node;
baseband processing circuitry;
at least one signal propagation path between the RF signal node and the baseband processing circuitry;
wherein said at least one signal propagation path includes variable gain circuitry configured to vary a gain applied to a signal propagating between the RF signal node and the baseband processing circuitry in response to the power of the RF signal detected by said RF power detector; and
wherein the variable gain circuitry is configured to vary said gain via first, coarse steps as well as via second, fine steps; and
wherein said at least one signal propagation path further comprises:
a mixer circuit between said RF signal node and said baseband processing circuitry; and
a variable gain stage between said mixer circuit and said RF signal node;
wherein the variable gain circuitry is configured to apply said first, coarse steps having equal amplitude and opposite signs at the mixer circuit and the variable gain stage and is further configured to apply said second, fine steps at the mixer circuit but not at the variable gain stage.

2. The circuit of claim 1, wherein said second, fine steps are submultiples of said first, coarse steps.

3. The circuit of claim 1, wherein:
said first, coarse steps comprise gain variations in dB units; and
said second, fine steps comprise gain variations up to about 0.1 dB.

4. The circuit of claim 1, wherein said at least one signal propagation path further comprises at least one of:
  a radiofrequency amplifier intermediate of said RF signal node and said mixer circuit; and
  a gain stage intermediate of said mixer circuit and said baseband processing circuitry;
  wherein said variable gain circuitry in said at least one signal propagation path further comprises coarse gain variation control circuitry configured to vary the gain of at least one of said radiofrequency amplifier and said gain stage via said first, coarse steps.

5. The circuit of claim 1, wherein said at least one signal propagation path comprises at least one of:
  a radiofrequency amplifier intermediate of said RF signal node and said mixer circuit; and
  a gain stage intermediate of said mixer circuit and said baseband processing circuitry,
  wherein said at least one of the radiofrequency amplifier and the gain stage is configured to vary a gain applied to a signal propagating therethrough both via said first, coarse steps as well as via said second, fine steps.

6. The circuit of claim 1, wherein said at least one signal propagation path includes a first signal propagation path between said RF signal node and said baseband processing circuitry, the first signal propagation path configured to propagate a first signal, and a second signal propagation path between said RF signal node and said baseband processing circuitry, the second signal propagation path configured to propagate a second signal, wherein the second signal is in quadrature to the first signal, and wherein the first signal propagation path and the second signal propagation path each comprise circuitry configured to vary a first gain applied to the first signal propagating through the first signal propagation path and a second gain applied to the second signal propagating through the second signal propagation path wherein said first gain matches said second gain.

7. The circuit of claim 1, wherein the circuit is a component of a receiver device, and wherein said at least one signal propagation path is configured to propagate a radio-frequency signal received at said RF signal node towards baseband receiver processing circuitry.

8. The circuit of claim 7, further comprising a control circuit configured to control operation of said variable gain circuitry in said at least one signal propagation path by:
  varying said gain in said at least one signal propagation path via said first, coarse steps having equal amplitude and opposite signs at different locations of said at least one signal propagation path; and
  varying said gain in said at least one signal propagation path via said second, fine steps at one location of said at least one signal propagation path.

9. The circuit of claim 1, wherein the circuit is a component of a transmitter device, wherein said at least one signal propagation path is configured to propagate a baseband signal received at said baseband processing circuitry towards said RF signal node for transmission therefrom as a radio-frequency signal.

10. The circuit of claim 9, further comprising a control circuit configured to control operation of said variable gain circuitry in said at least one signal propagation path by:
  varying said gain in said at least one signal propagation path via said first, coarse steps having equal amplitude and opposite signs at different locations of said at least one signal propagation path; and
  varying said gain in said at least one signal propagation path via said second, fine steps at one location of said at least one signal propagation path.

11. The circuit of claim 1, further comprising a control circuit configured to control operation of said variable gain circuitry in said at least one signal propagation path by:
  varying said gain in said at least one signal propagation path via said first, coarse steps having equal amplitude and opposite signs at different locations of said at least one signal propagation path; and
  varying said gain in said at least one signal propagation path via said second, fine steps at one location of said at least one signal propagation path.

12. The circuit of claim 1, wherein said at least one signal propagation path comprises:
  a further variable gain stage between said mixer circuit and said baseband processing circuitry;
  wherein the variable gain circuitry is configured to apply said first, coarse steps having equal amplitude and opposite signs at the mixer circuit and the further variable gain stage and is further configured to apply said second, fine steps at the at the mixer circuit but not at the further variable gain stage.

13. The circuit of claim 1, wherein said at least one signal propagation path comprises:
  a first variable gain stage between said RF signal node and said baseband processing circuitry;
  a second variable gain stage between said first variable gain stage and said baseband processing circuitry;
  wherein the variable gain circuitry is configured to apply said first, coarse steps having equal amplitude and opposite signs at the first variable gain stage and is further configured to apply said second, fine steps at the at the first variable gain stage but not at the second variable gain stage.

14. The circuit of claim 1, wherein said at least one signal propagation path comprises:
  a first variable gain stage between said RF signal node and said baseband processing circuitry;
  a second variable gain stage between said first variable gain stage and said baseband processing circuitry;
  wherein the variable gain circuitry is configured to apply said first, coarse steps having equal amplitude and opposite signs at the second variable gain stage and is further configured to apply said second, fine steps at the at the second variable gain stage but not at the first variable gain stage.

* * * * *